US005216211A

United States Patent [19]

Renk, Jr.

[11] Patent Number: 5,216,211

[45] Date of Patent: Jun. 1, 1993

[54] AUDIO-VISUAL FURNITURE STAND

[75] Inventor: Thomas E. Renk, Jr., Indianapolis, Ind.

[73] Assignee: Thomson Consumer Electronics, Inc., Indianapolis, Ind.

[21] Appl. No.: 579,786

[22] Filed: Sep. 7, 1990

[51] Int. Cl.[5] .................... H05K 5/00

[52] U.S. Cl. .................... 181/153; 181/199; 312/7.2

[58] Field of Search .................... 181/153, 154, 198, 199; D14/33, 34; 312/7.2

[56] References Cited

U.S. PATENT DOCUMENTS

| | | | |
|---|---|---|---|
| D. 212,004 | 8/1968 | Emond | D26/14 |
| D. 221,441 | 8/1971 | Ishikawa | D26/14 |
| D. 222,676 | 11/1971 | Ishikawa | D26/14 |
| D. 223,161 | 3/1972 | Anchel | D26/14 |
| D. 224,909 | 10/1972 | Krause | D26/14 |
| D. 227,478 | 6/1973 | Ekdahl et al. | D26/14.6 |
| D. 227,904 | 7/1973 | Takeoka et al. | D26/14 G |
| D. 229,066 | 11/1973 | Ekdahl et al. | D26/14 G |
| D. 229,141 | 11/1973 | Sandler | D26/14 G |
| D. 230,548 | 3/1974 | Robinson | D6/236 |
| D. 231,660 | 5/1974 | Ishikawa | D26/14 G |
| D 238,183 | 12/1975 | Lou | D26/14 G |
| D. 238,496 | 1/1976 | Brown et al. | D26/14 G |
| D. 247,236 | 2/1978 | Croup | D14/33 |
| D. 247,489 | 3/1978 | Jabara | D14/33 |
| D. 248,394 | 7/1978 | Jensen | D14/33 |
| D. 251,909 | 5/1979 | Larson | D14/33 |
| D. 251,973 | 5/1979 | Klopfer et al. | D14/33 |
| D. 253,109 | 10/1979 | Kashidaira | D14/34 |
| D. 259,932 | 7/1981 | Hawkins et al. | D14/33 |
| D. 266,759 | 11/1982 | Jabara | D14/33 |
| 2,222,476 | 10/1971 | Ohyama et al. | D26/14 |
| 2,955,669 | 10/1960 | Rice | 181/153 |
| 3,090,462 | 5/1963 | Huff et al. | 181/153 |
| 3,500,953 | 3/1970 | Lahti | 181/199 X |
| 3,926,487 | 12/1975 | Reyes | 312/223 |
| 3,967,065 | 6/1976 | Ward | 181/199 X |

*Primary Examiner*—L. T. Hix
*Assistant Examiner*—Khanh Dang
*Attorney, Agent, or Firm*—Woodard, Emhardt, Naughton, Moriarty & McNett

[57] ABSTRACT

An audio-visual furniture stand is disclosed which includes three horizontal shelves. An upper shelf for supporting a television, VCR, or other audio-visual equipment is provided. The furniture stand also includes a second and third shelf disposed below the upper shelf and designed to receive in the openings defined by the shelves and the legs of the stand, two speaker enclosures. The speaker enclosures are eight-sided and each includes two hexagonal walls designed to enable various orientations or positions of the speakers as they rest upon supporting surfaces. The speaker enclosures also include a protective grill cover which may include color coordinated cloth or foam material which matches the interior decor of a particular room or home.

16 Claims, 2 Drawing Sheets

AUDIO-VISUAL FURNITURE STAND

BACKGROUND OF THE INVENTION

This invention relates to furniture and more specifically to furniture stands designed to support audio-visual equipment.

In recent years, high fidelity stereo audio electronic signals have been made available in conjunction with television signals so that the home viewer may enjoy stereophonic sound while viewing a television broadcast. Additionally, video cassette recorders are available which produce left and right stereophonic sound as well as the video signal for reproducing a television picture. With the advent of multi-channel television sound (MTS) and stereo VCR's, the demand for furniture and stereo speaker systems for use in conjunction with stereo TV's and VCR's has increased.

In certain viewing areas of the home, space is limited with regard to that allocated for electronic entertainment equipment, specifically televisions and stereos. With this in mind, an audio-visual furniture stand which provides a storage space for a stereo speaker system as well as a surface for resting thereon a television and/or VCR equipment is needed.

SUMMARY OF THE INVENTION

An audio-visual furniture stand, according to the present invention, comprises a first planar horizontal member, a second planar horizontal member disposed above the first planar horizontal member, a third planar horizontal member disposed above the second planar horizontal member, first and second vertical members attached to the first, second and third planar horizontal members, the vertical members attached to the horizontal members so as to maintain a fixed vertical displacement between the horizontal members and define a first space between the first and second horizontal members and a second space between the second and third horizontal members, and first and second audio speaker enclosures, the speaker enclosures being sized for removable insertion into the first or second spaces so that the first enclosure is disposed substantially vertically above the second enclosure when both of the enclosures are inserted into the spaces.

An eight-sided speaker enclosure, according to the present invention, comprises a speaker, a rectangular front wall having two shorter sides and two longer sides, the front wall including an aperture and the speaker being mounted around the periphery of the aperture, first and second parallel and congruent hexagonal walls, each having a shape in which a first side is longer than the others and equal in length to the longer side of the front wall, a second and sixth sides perpendicularly extending from opposite ends of the first side, a fourth side parallel to the first side, a third and fifth sides which if extended would perpendicularly intersect each other, and positioned between the second and fourth sides, and the sixth and fourth sides, respectively, second, third, fourth, fifth and sixth rectangular walls sequentially connected in series and being connected between the corresponding sides of the first and second hexagonal walls, the rectangular front wall being connected along its two longer sides to the two first sides of the first and second hexagonal walls, respectively, and along its two shorter sides to the second and sixth rectangular walls respectively.

It is an object of the present invention to provide an improved audio-visual furniture stand.

It is another object of the present invention to provide an audio-visual furniture stand which provides a vertical or over and under arrangement of two stereo speaker enclosures.

It is yet another object of the present invention to provide speaker enclosures having eight sides thereby enabling a multitude of resting positions or orientations in which the speaker enclosures may be positioned.

These and other objects of the present invention will become more apparent from the following description of the preferred embodiment.

DESCRIPTION OF THE PREFERRED EMBODIMENT

Figure 1:
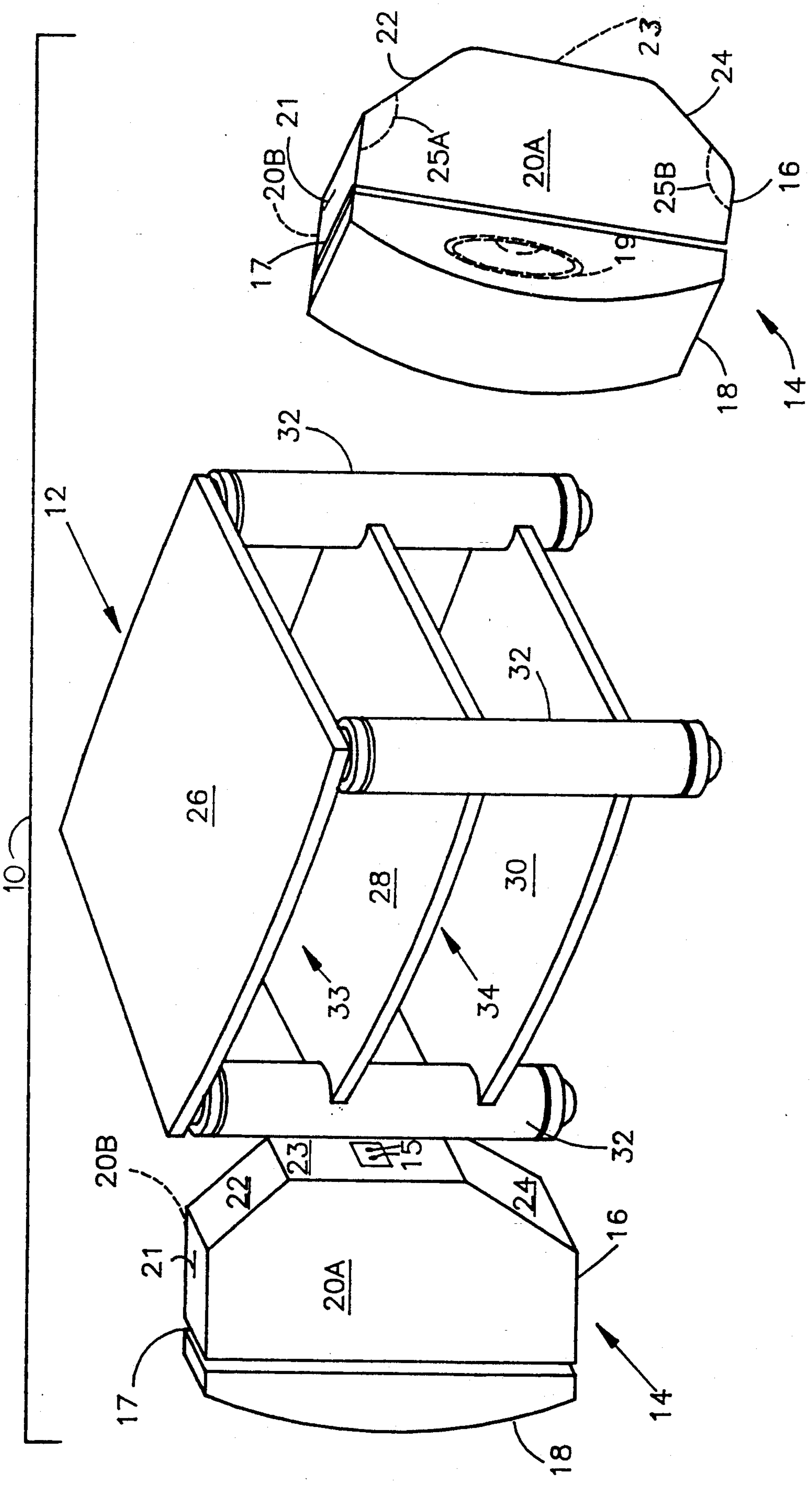
FIG. 1 is a perspective view of the audio-visual furniture stand and speaker enclosures according to the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring now to FIG. 1, an audio-visual furniture stand and corresponding speaker system 10, according to the present invention, is shown. The system 10 includes a furniture stand 12 and identical speaker enclosure 14. Each speaker enclosure 14 includes an eight-sided enclosure having a front wall 17, two hexagonal walls 20A and 20B, short walls 16 and 21, inclined back walls 22 and 24, and a rear wall 23. All of the walls of the enclosure (walls 16, 17, 20A, 20B, 21, 22, 23 and 24) are planar. Speaker grill 18 is attached to the front wall 17 of enclosure 14. Grill 18 is sized to conform with the rectangular shape of front wall 17, and is removably attached or may be permanently attached to the speaker enclosure 14. Front wall 17 includes an aperture wherein speaker 19 (as shown by broken lines) are mounted around the periphery thereof (See also FIG. 2). Speaker grill 18 is a sound transparent material designed to protect the speakers 19 (shown by broken lines) which are mounted on front wall 17. In addition, speaker grill 18 provides an aesthetic or cosmetic treatment of the speaker enclosure 14 to enable various colored cloths to be stretched over a wooden or plastic frame wherein the cloths match the interior decoration scheme of a home or room. Terminals 15 are electrically connected to speakers 19 and enable the user to connect a high-power audio signal source (not shown) to speakers 19. Terminals 15 enable convenient connections to speaker wire, and such connector terminals are well known in the art of speaker enclosures.

The planes in which inclined back walls 22 and 24 are situated, intersect behind rear wall 23 in a perpendicular fashion. Hexagonal walls 20A and 20B and short walls 16 and 21 are attached to front wall 17 at right angles.

Rear wall 23 is situated in a plane parallel to front wall 17.

Angles 25A and 25B in one embodiment of the present invention are approximately 135°. However, it is recognized that angles 25A and 25B may be unequal resulting in inclined back walls 22 and 24 having different angular inclinations with respect to front wall 17. When angles 25A and 25B are unequal the enclosures 14 are positionable on inclined back walls 22 or 24 to achieve at least two different angular inclinations for the front wall 17 of enclosures 14. In addition, enclosures 14 may be situated to rest upon hexagonal walls 20, on short walls 21 or 16, or on rear wall 23. The weight distribution of each enclosure 14 is such that the enclosures 14 will rest stably upon any of the above surfaces when supported by a flat level surface.

Stand 12 includes horizontal members or shelves 26, 28 and 30, all attached to vertical support members 32. The four vertical support members 32 are attached to the horizontal members 26, 28 and 30 by adhesives such as glue or by way of tacks, nails or other techniques such as dove-tailing or pinning well known in the furniture art. Vertical members 32 include attractive profiles at the top and bottom thereof which are pleasing to the eye. Typically members 26, 28, 30 and 32 are made of wood or other suitable materials such as plastic or metal. Although only three vertical members 32 are shown in FIG. 1, it is to be understood that a fourth vertical member is attached to horizontal members 26, 28 and 30 at a fourth corner to form a four-legged furniture stand.

The openings defined by the horizontal members and the vertical members are indicated by 33 and 34. These openings or spaces are correspondingly sized to receive speaker enclosures 14. More specifically, the dimensions of front wall 17 and grill 18 are slightly smaller than the dimensions of the spaces 33 and 34, thus enabling speaker enclosures 14 to be inserted into spaces 33 and 34 in an over-under or vertical arrangement. Thus, for storage purposes or for applications where space is limited, speaker enclosure 14 may be inserted into spaced 33 and 34. In other applications where more space is available and the imaging effects of stereophonic sound are desired, speaker enclosures 14 can be removed from spaces 32 and 34 and placed apart an appropriate distance. It should also be noted that speaker enclosures 14 may rest upon any of the planar surfaces or walls of the enclosures (except front wall 17) when the enclosures are removed from within spaces 33 and 34.

In the preferred embodiment, openings 33 and 34 are dimensioned not only to receive speaker enclosures 14, but also to receive standard sized VCR and videodisk playback units. Typically, the horizontal dimension of openings 33 and 34 is approximately 19.0 inches, the vertical dimension is approximately 7.32 inches, and the depth is approximately 17.0 inches measured from the front and rear edges of shelves 28 and 30. Further, shelf 26 is dimensionally large enough and structurally suitable to support any commercially available table-top television receiver. Typical dimensions for shelf 26 are: 19.6 inches deep by 30.24 inches wide.

Figure 2:
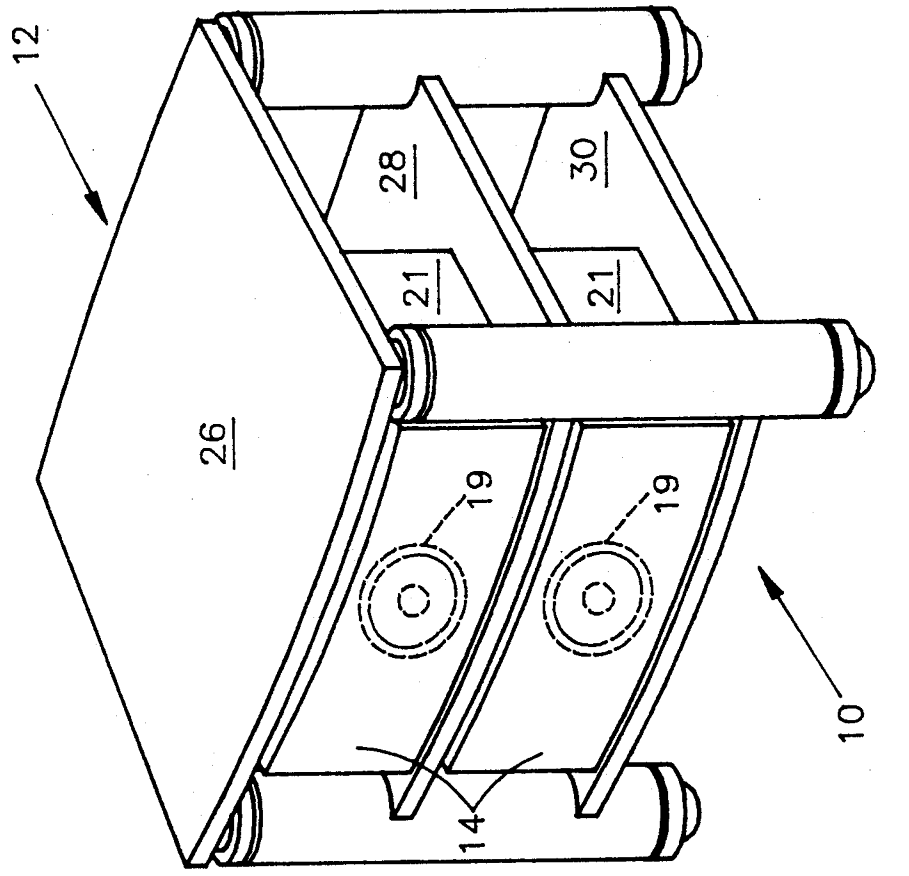
FIG. 2 is a perspective view of the audio-visual furniture stand with the speaker enclosures inserted between the shelves thereof.

Referring now to FIG. 2, a perspective view of the audio-visual furniture stand 10 according to the present invention is shown with the speaker enclosures 14, within which speakers 19 (shown by broken lines) are mounted, disposed in an over-under arrangement when inserted between the shelves of the stand 12 into openings 33 and 34. The shelves 26, 28, and 30 are spaced apart a sufficient distance to receive the longitudinally oriented speaker enclosures 14 therebetween. Limitations on available floor space are accommodated in a given location by placing the enclosures 14 on the shelves of stand 12 thereby making floor space previously needed for speaker enclosures available for other uses.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. An audio-visual furniture stand and speaker enclosure combination comprising:

a first planar horizontal member;

a second planar horizontal member disposed above said first planar horizontal member;

a third planar horizontal member disposed above said second planar horizontal member;

first and second vertical members attached to said first, second, and third planar horizontal members, said vertical members attached to said horizontal members so as to maintain a fixed vertical displacement between said horizontal members and define a first space between said first and second horizontal members and a second space between sad second and third horizontal members; and first and second audio speaker enclosures, said speaker enclosures being sized for removable insertion into said first or second spaces so that said first enclosure is disposed substantially vertically above said second enclosure when both of said enclosures are inserted into said spaces.

2. The stand of claim 1 including third and fourth vertical members attached to said horizontal members and wherein said planar horizontal members are substantially rectangular.

3. The stand of claim 2 wherein said third planar horizontal member is larger in area than said first or second planar horizontal members.

4. The stand of claim 3 wherein said horizontal members all include top, bottom, and lateral surfaces and wherein said vertical members attach to the lateral edges of said first and second horizontal members, and said vertical members attach to the bottom surface of said third horizontal member.

5. The stand of claim 4 wherein said vertical members are generally cylindrical in horizontal cross-section.

6. The stand of claim 4 wherein said vertical members are generally rectangular in horizontal cross-section.

7. The stand of claim 1 wherein said horizontal and vertical members are made of wood.

8. The stand of claim 1 wherein said speaker enclosures are eight-sided and are comprised of:

a speaker;

a rectangular front wall having two shorter sides and two longer sides, said front wall including an aperture and said speaker being mounted around the periphery of said aperture, said front wall sized to correspond with said first and second spaces;

two parallel and congruent hexagonal walls, a fist side of each of said hexagonal walls attached to and equal in length to a respective one of the longer sides of said front wall;

first and second parallel rectangular short walls extending from the shorter sides of said front wall at right angles to the front side and being attached between corresponding edges of said hexagonal walls;

a rear rectangular wall parallel to said front wall and attached between corresponding edges of said hexagonal walls; and first and second rectangular inclined walls which are oriented in planes perpendicular to each other and which are attached between said rear wall and said first and second short walls, respectively, and between corresponding edges of said hexagonal walls.

9. An eight-sided speaker enclosure comprising:

a speaker;

a rectangular front wall having two shorter sides and two longer sides, said front wall including an aperture having a periphery, and said speaker being mounted to said front wall around the periphery of said aperture;

first and second parallel and congruent hexagonal walls each having a sequentially joined first side, second side, third side, fourth side, fifth side and sixth side, which sixth side joins said first side, and in which (a) said first side is longer than any of said second, third, fourth, fifth, and sixth sides and is equal in length to said longer sides of said front wall, (b) said second side and said sixth side perpendicularly extend from opposite ends of said first side, (c) said fourth side is parallel to said first side, (d) said third side and said fifth side are oriented so that if extended they would substantially perpendicularly intersect each other;

second, third, fourth, fifth and sixth rectangular walls sequentially connected in series and being connected between the corresponding sides of said first and second hexagonal walls;

said rectangular front wall being connected along its said two longer sides to said first sides of said first and second hexagonal walls, respectively, and said front wall also being connected along its said two shorter sides to said second and sixth rectangular walls respectively.

10. The speaker enclosure of claim 9 wherein said speaker enclosure has weight and the weight of said enclosure and speaker is distributed so that the enclosure would rest in a stable condition if said third wall were placed on a level support surface.

11. The speaker enclosure of claim 10 wherein the weight of said enclosure and speaker is distributed so that the enclosure will rest in a stable condition when said second, third, fifth or sixth rectangular wall or said first and second hexagonal walls are placed on a level surface.

12. The speaker enclosure of claim 9 wherein a first angle is defined by said second and third sides, and a second angle is defined by said fifth and sixth sides and wherein said first and second angles are each approximately 135° angles.

13. The speaker enclosure of claim 9 wherein said front wall, said second, third, fourth, fifth, and sixth rectangular walls, and said hexagonal walls are made of wood products.

14. The speaker enclosure of claim 9 wherein said walls are made of plastic materials.

15. The speaker enclosure of claim 9 including a substantially planar grill frame removably attached to said front wall, said grill frame including sound transparent material attached and covering said grill frame.

16. The speaker enclosure of claim 9 including means removably attached to said front wall for protecting said speaker from damage and for allowing sound produced by said speaker to pass through said means.

* * * * *

UNITED STATES PATENT AND TRADEMARK OFFICE

CERTIFICATE OF CORRECTION

PATENT NO. : 5,216,211

DATED : June 1, 1993

INVENTOR(S) : Thomas E. Renk, Jr.

It is certified that error appears in the above-identified patent and that said Letters Patent is hereby corrected as shown below:

In Column 2, at line 50, please correct "speaker" to read --speakers--.

In Column 3, at line 41, please correct "enclosure" to read --enclosures--.

In column 3, at line 42, please correct "spaced" to read --spaces--.

In column 4, at line 31, please correct "sad" to read --said--.

In column 4, at line 67, please correct "fist" to read --first--.

Signed and Sealed this

Eighth Day of February, 1994

Attest:

BRUCE LEHMAN

Attesting Officer

Commissioner of Patents and Trademarks